(12) United States Patent
Lin et al.

(10) Patent No.: US 6,667,892 B1
(45) Date of Patent: Dec. 23, 2003

(54) VOLTAGE-AVERAGED TEMPERATURE COMPENSATION METHOD AND CORRESPONDING CIRCUIT THEREOF

(75) Inventors: Yu-Tong Lin, Taichung (TW); Wen-Cheng Yen, Taichung (TW)

(73) Assignee: Faraday Technology Corp., Hsinchu (TW)

( * ) Notice: Subject to any disclaimer, the term of this patent is extended or adjusted under 35 U.S.C. 154(b) by 0 days.

(21) Appl. No.: 10/265,702

(22) Filed: Oct. 8, 2002

(51) Int. Cl.$^7$ ................................................ H02M 7/10
(52) U.S. Cl. .......................... 363/49; 323/901; 375/257
(58) Field of Search ............................ 363/49; 323/901, 323/907, 908; 375/257

(56) References Cited

U.S. PATENT DOCUMENTS

| | | | | |
|---|---|---|---|---|
| 5,471,498 A | * | 11/1995 | Kuo | .......................... 375/295 |
| 5,519,728 A | * | 5/1996 | Kuo | .......................... 375/257 |
| 5,798,637 A | * | 8/1998 | Kim et al. | .................. 323/313 |
| 6,559,730 B1 | * | 5/2003 | Marvin et al. | .............. 331/158 |

* cited by examiner

*Primary Examiner*—Bao Q. Vu
(74) *Attorney, Agent, or Firm*—Rabin & Berdo, P.C.

(57) ABSTRACT

A voltage-averaged temperature compensation method at start-up. The method implements two pluralities of PMOS devices such that a respective voltage-averaged temperature compensation circuit produces a first temperature voltage and a second temperature voltage to compensate temperature effect and accordingly produces an output voltage having a damping waveform in lower region when activating the first plurality of PMOS devices and a desired waveform in upper region when activating the second plurality of PMOS devices. As such, the error reference or control due to a prior damping waveform is eliminated.

12 Claims, 3 Drawing Sheets

VOLTAGE-AVERAGED TEMPERATURE COMPENSATION METHOD AND CORRESPONDING CIRCUIT THEREOF

BACKGROUND

1. Field of the Invention

The invention relates to a signal processing method for temperature compensation, more particularly to a voltage-averaged temperature compensation method at start-up and corresponding circuit thereof, to produce an output voltage signal.

2. Description of the Related Art

Many devices, for example, MOS devices, have an initialization time (enable time) after receiving a supply voltage. During initialization (startup), the output states are not defined and the outputs will toggle due to temperature effects such as ambient temperature. In order to achieve a well-defined output state, a temperature compensation structure is required.

FIG. 1 is a block diagram of a typical temperature compensation structure for a reference voltage generation circuit. FIG. 2 is a diagram of an internal circuit with respect to the structure of FIG. 1. FIG. 3 is a graph of an output waveform of FIG. 2.

As shown in FIGS. 1 and 2, a resistor Rn connected in parallel to one or more diodes D (FIG. 2) can produce negative temperature current NTC (with respect to the second current generation circuit 12 of FIG. 1) through the resistor Rn and positive temperature current PTC (with respect to the first current generation circuit 11 of FIG. 1) through the one or more diodes. The resistor Rn can be a thermister with a negative temperature coefficient variation. The currents NTC and PTC are added to the drain of a PMOS device (with respect to the current addition circuit 13 of FIG. 1). For example, in this case, the drain of the PMOS device MA adds currents NTCA, PTCB of a grounded resistor RA and a grounded diode DA to a terminal TA, wherein the resistor RA and the diode DA are connected in parallel. The terminal TA is further connected to the negative terminal of an amplifier 22. The drain of the PMOS device MB adds currents NTCB, PTCB of a grounded resistor RB and a cascade of grounded resistor RN and diodes DB to a terminal TB, wherein the resistor RB and the cascade are connected in parallel. The terminal TB is further connected to the positive terminal of the amplifier 22. The drain of the PMOS device MC connected to a load resistor R adds all branch currents as a current output PTC+NTC of the entire circuit. The current output PTC+NTC is converted by the load resistor R (with respect to the current-to-voltage conversion circuit 14 of FIG. 1) and finally output in a voltage form VBG. Gates of the cited PMOS devices MA, MB, MC are connected to outputs of a start-up circuit 21 and the amplifier 22. As such, when the start-up circuit 21 sends a trigger signal SIG to turn on all PMOS devices MA, MB, MC through the cascade gates, temperature compensation is performed by the resistor RA, RB. After the temperature compensation, the compensated temperature current on terminal TB and the compensated temperature current on terminal TA are fed into positive and negative terminals of the amplifier 22 to accordingly produce an output current out. The output current out activates a desired bias current to produce a step-down voltage VBG on resistor R and the step-down voltage VBG is output to, for example, the reference voltage generation circuit of a detector as a reference voltage.

However, due to the internal impedance of the cited resistors, the VBG waveform is similar to a RLC circuits's output response with critical damping, as shown in FIG. 3. This waveform lacks an obvious control signal with logic H/L and may cause an error control since it may be applied as a reference voltage output of a detector. Therefore, this is not suitable for the temperature compensation circuit of a reference voltage generation circuit.

SUMMARY OF THE INVENTION

Accordingly, an object of the invention is to provide a voltage-averaged temperature compensation method at start-up and corresponding circuit, to minimize the damping distortion and assure a desired output.

The invention provides a voltage-averaged temperature compensation method at start-up, comprising the steps of: implementing a first plurality of PMOS devices with gates connected to an output of a start-up circuit, sources connected to an operating voltage, and drains including a first drain, a second drain and a third drain; implementing a second plurality of PMOS devices with gates connected to an output of an amplifier, sources connected to the operating voltage, and drains connected to the drains of the first plurality of PMOS devices one-to-one; implementing a positive voltage generation device consisting of a cascade of, between the ground and the first drain, a resistor and multiple parallel diodes, wherein the connection terminal of the resistor and the one drain connects to a positive terminal of the amplifier; implementing a negative voltage generation device consisting of a grounded forward-biased diode with an anode connected to a negative terminal of the amplifier, the second drain and a voltage average circuit; implementing a load resistor between the ground and the third drain, wherein the connection terminal of the load resistor and the third drain is connected to the voltage average circuit; activating the first plurality of PMOS devices through the output of the start-up circuit to produce a damping waveform in lower region of an output voltage; and activating the second plurality of PMOS devices through the output of the amplifier, such that the voltage average circuit averages outputs of the second drain and the third drain to produce a desired waveform as a reference or control signal in upper region of the output voltage.

DETAILED DESCRIPTION OF THE INVENTION

Figure 1:
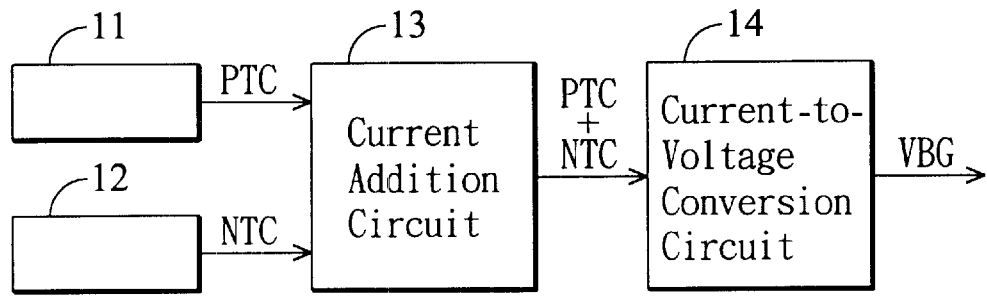
FIG. 1 is a block diagram of a typical temperature compensation structure for a reference voltage generation circuit.
Figure 2:
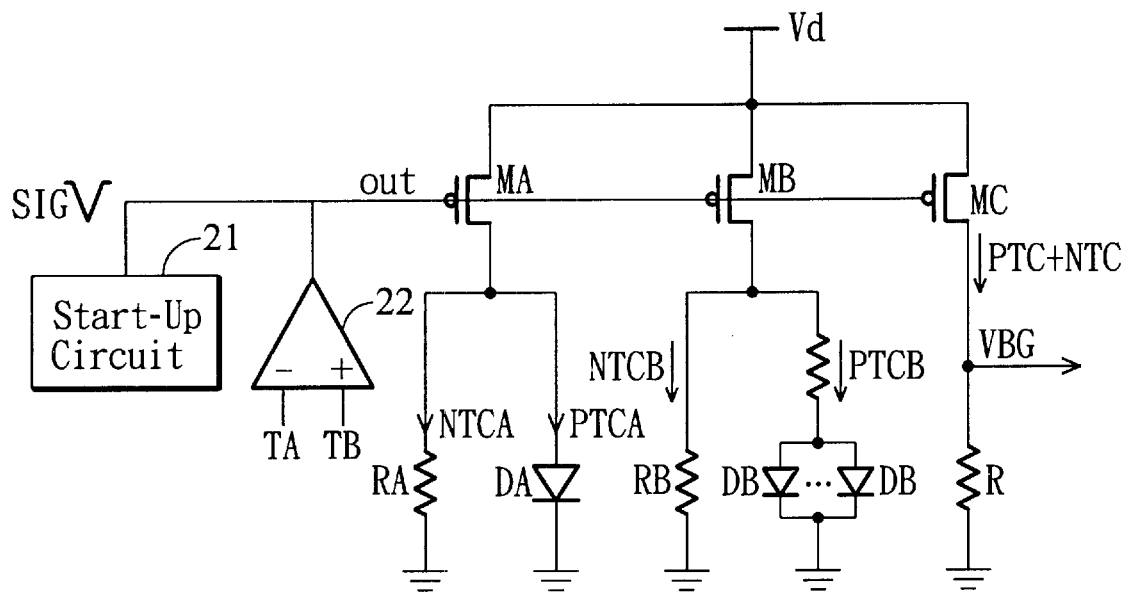
FIG. 2 is a diagram of an internal circuit with respect to the structure of FIG. 1.
Figure 3:
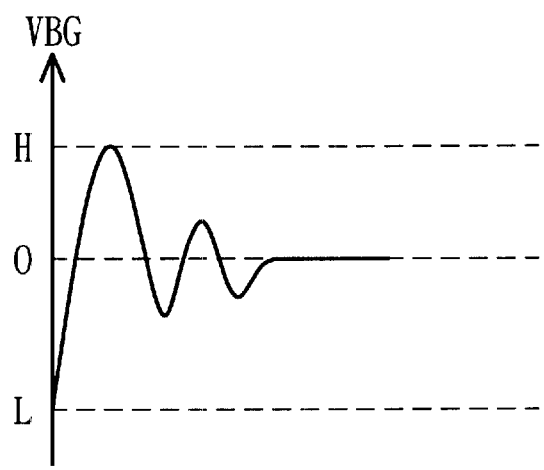
FIG. 3 is a graph of an output waveform of FIG. 2.
Figure 4:
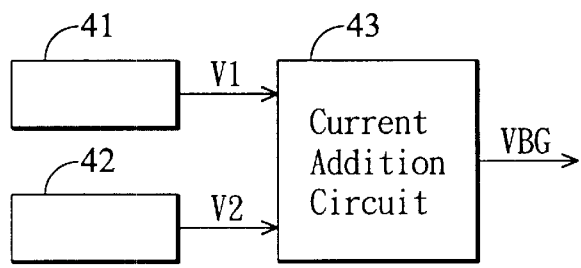
FIG. 4 is a block diagram of a temperature compensation structure for a reference voltage generation circuit according to the invention.
Figure 5:
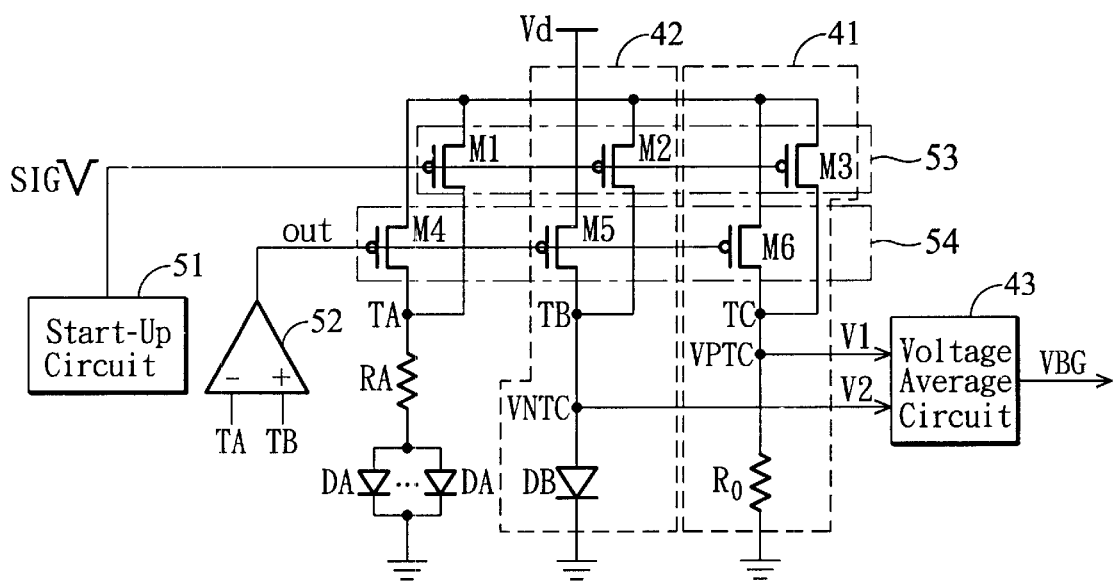
FIG. 5 is a diagram of an internal circuit with respect to the structure of FIG. 4 according to the invention.
Figure 6:
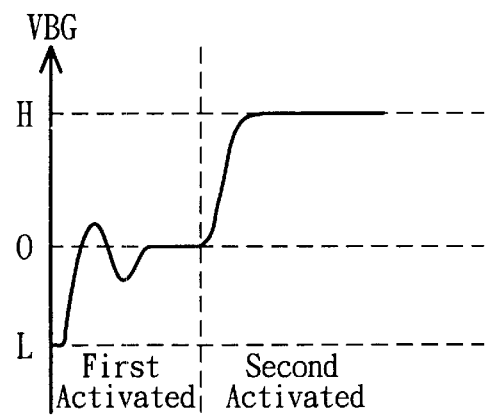
FIG. 6 is a graph of an output waveform of FIG. 5.

FIG. 4 is a block diagram of a temperature compensation structure for a reference voltage generation circuit according to the invention. FIG. 5 is a diagram of an internal circuit with respect to the structure of FIG. 4 according to the invention. FIG. 6 is a graph of an output waveform of FIG. 5.

In FIG. 4, the structure essentially includes a positive temperature circuit 41 to produce a first voltage V1, a negative temperature circuit 42 to produce a second voltage V2, and a voltage average circuit 43 to average the first voltage and the second voltage and thus produce an output voltage VBG with the desired waveform. In FIG. 5, the circuit includes a start-up circuit 51, an amplifier 52, a first three-PMOS device 53 (M1–M3), a second three-PMOS device 54 (M4–M6), a resistor RA, a set of parallel diodes DA, a diode DB, a load resistor Ro and a voltage average circuit 43, wherein devices M2, M5 and DB are composed of the circuit 42 and devices M3, M6 and Ro are composed of the circuit 43.

Figure 7:
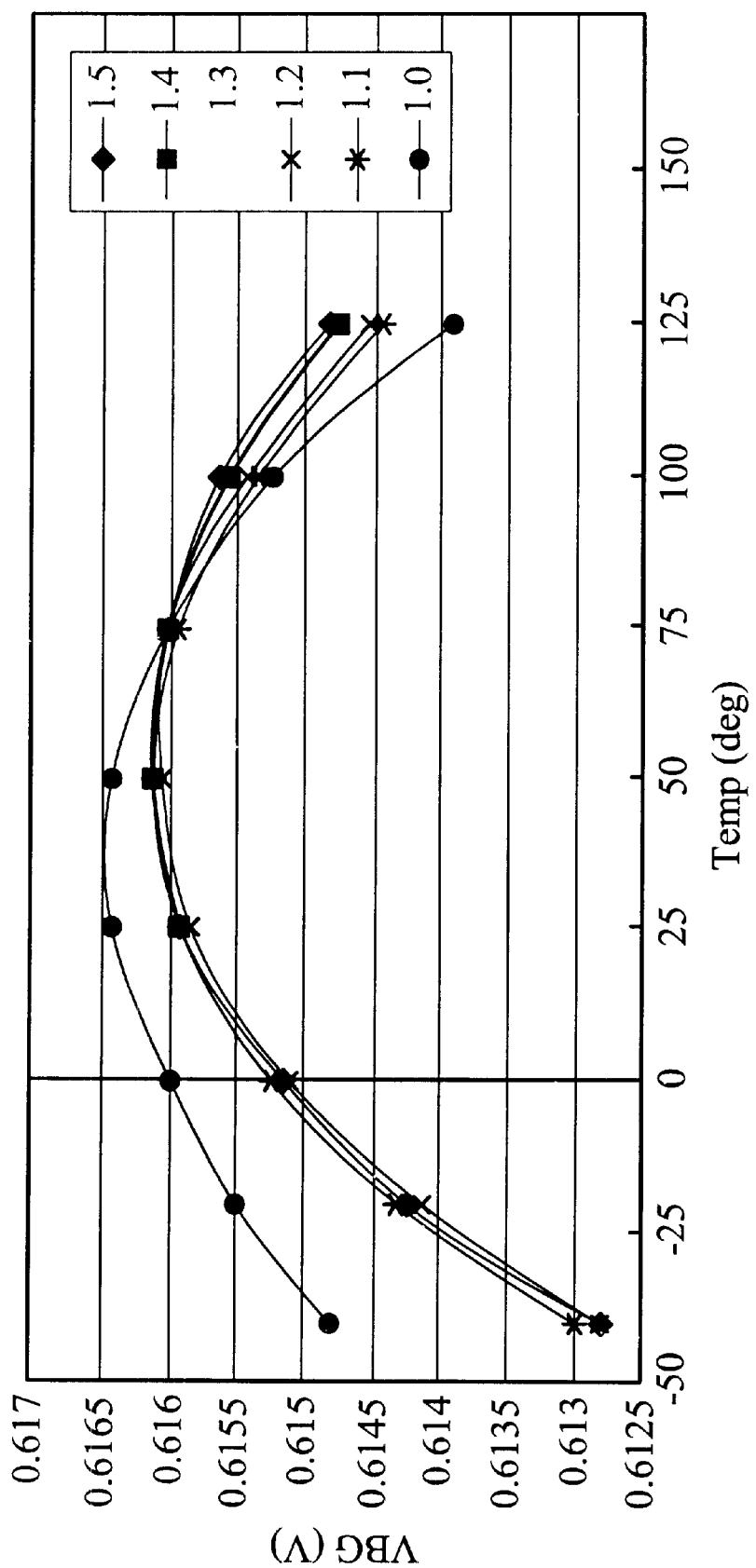
FIG. 7 is a graph of different voltage-to-temperature curves according to FIG. 5 of the invention.

As shown in FIGS. 4, 5 and 6, to achieve the voltage compensation, a voltage-averaged temperature compensation method at start-up with respect to the circuit is provided, comprising the following steps. Firstly, a first plurality of PMOS devices 53 with gates connected to an output out1 of the start-up circuit 51, sources connected to an operating voltage VDD, and drains including a first drain TA, a second drain TB and a third drain TC are implemented. Secondly, a second plurality of PMOS devices 54 with gates connected to an output out2 of the amplifier 52, sources connected to the operating voltage, and drains connected to the drains of the first plurality of PMOS devices one-to-one are implemented. One connection terminal TA of the drains connects to a negative terminal of the amplifier 52 and the other connection terminal TB of the drains connects to a positive terminal of the amplifier 52, Thirdly, a positive voltage generation device consisting of a cascade of, coupled between the ground and the first drain TA, a resistor RA and multiple parallel diodes DA is implemented. Fourthly, a negative voltage generation device consisting of a grounded forward-biased diode DB with an anode connected to a positive terminal of the amplifier 52, the second drain TB and the voltage average circuit 43 is implemented. The connection terminal of the positive terminal of the amplifier 52, the second drain TB and the voltage average circuit 43 is a terminal VNTC that outputs the second voltage V2 (the same voltage as that of FIG. 4). Fifthly, a load resistor Ro between the ground and the third drain TC is implemented, wherein the connection terminal VPTC of the load resistor Ro and the third drain TC is a terminal that outputs the first voltage V1 (the same voltage as that of FIG. 4). Sixthly, the first plurality 53 of PMOS devices M1–M3 is activated such that a small DC bias current from the output out1 of the start-up circuit 51 is provided and thus produce a damping waveform in lower region of an output voltage VBG and then seventhly, when activating the second plurality of PMOS devices through the output of the amplifier, the voltage average circuit produces a desired waveform as a reference or control signal in upper region of the output voltage VBG. The entire output waveform of the voltage VBG is shown in FIG. 6 and the result operating in the circuit of FIG. 5 is shown in FIG. 7, wherein the temperature compensation effect is clearly seen at an output voltage 0.615V and operating voltages from 1.5V to 1V by 0.1 increments.

In summary, the invention can obtain the desired waveform output from the inventive temperature compensation method and corresponding circuit without error.

These modifications can be made to the invention in light of the above detailed description. The terms used in the following claims should not be construed to limit the invention to the specific embodiment disclosed in the specification and the claims. Rather, the scope of the invention is to be determined entirely by the following claims, which are to be construed in accordance with established doctrines of claim interpretation.

What is claimed is:

1. A voltage-averaged temperature compensation method at start-up, comprising the steps of:
   (a) implementing a first plurality of PMOS devices with gates connected to an output of a start-up circuit, sources connected to an operating voltage, and drains including a first drain, a second drain and a third drain;
   (b) implementing a second plurality of PMOS devices with gates connected to an output of an amplifier, sources connected to the operating voltage, and drains connected to the drains of the first plurality of PMOS devices one-to-one;
   (c) implementing a positive voltage generation device consisting of a cascade of, coupled between the ground and the first drain, a resistor and multiple parallel diodes, wherein the connection terminal to the first drain is connected to a negative terminal of the amplifier;
   (d) implementing a negative voltage generation device consisting of a grounded forward-biased diode with an anode connected to a positive terminal of the amplifier, the second drain and a voltage average circuit, such that a negative voltage is output from the second drain to the voltage average circuit;
   (e) implementing a grounded load resistor connected to the third drain and the voltage average circuit such that a positive voltage is output from the third drain to the voltage average circuit;
   (f) when operating, activating the first plurality of PMOS devices such that a small DC bias current from the start-up circuit is provided and thus produce a damping waveform in lower region of an output voltage; and
   (g) activating the second plurality of PMOS devices through the output of the amplifier such that the voltage average circuit produces a desired waveform immediately adjacent to the damping waveform in upper region of the output voltage such that the output voltage is suitable for a reference or control voltage because the desired waveform has a DC value.

2. The method of claim 1, wherein in step (d) the negative voltage corresponds to a negative temperature current output by the second drain.

3. The method of claim 1, wherein in step (e) the positive voltage corresponds to a positive temperature current output by the third drain.

4. The method of claim 1, wherein in step (g) the DC value is a reference voltage.

5. The method of claim 1, wherein in step (g) the DC value is a control voltage with logic high.

6. The method of claim 1, wherein in step (g) the DC value is a control voltage with logic low.

7. A voltage-averaged temperature compensation circuit at start-up, comprising:
   a first plurality of PMOS devices with gates connected to an output of a start-up circuit, sources connected to an operating voltage, and drains including a first drain, a second drain and a third drain;
   a second plurality of PMOS devices with gates connected to an output of an amplifier, sources connected to the operating voltage, and drains connected to the drains of the first plurality of PMOS devices one-to-one;

a positive voltage generation device consisting of a cascade of, coupled between the ground and the first drain, a resistor and multiple parallel diodes, where in the connection terminal to the first drain is connected to a negative terminal of the amplifier;

a negative voltage generation device consisting of a grounded forward-biased diode with an anode connected to a positive terminal of the amplifier, the second drain and a voltage average circuit, such that a negative voltage is output from the second drain to the voltage average circuit; and a grounded load resistor connected to the third drain and the voltage average circuit such that a positive voltage is output from the third drain to the voltage average circuit in order to average with the negative voltage and accordingly produce an output voltage having a damping waveform in lower region when activating the first plurality of PMOS devices and a desired waveform in upper region when activating the second plurality of PMOS devices.

8. The method of claim 7, wherein the negative voltage corresponds to a negative temperature current output by the second drain.

9. The circuit of claim 7, wherein the positive voltage corresponds to a positive temperature current output by the third drain.

10. The circuit of claim 7, wherein the desired waveform is a DC reference voltage.

11. The circuit of claim 7, wherein the desired waveform is a DC control voltage with logic high.

12. The circuit of claim 7, wherein the desired waveform is a DC control voltage with logic low.

* * * * *